(12) United States Patent
Hanaoka

(10) Patent No.: US 8,803,634 B2
(45) Date of Patent: Aug. 12, 2014

(54) BRANCHING DEVICE

(75) Inventor: Kunitoshi Hanaoka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 242 days.

(21) Appl. No.: 13/241,301

(22) Filed: Sep. 23, 2011

(65) Prior Publication Data

US 2012/0081192 A1 Apr. 5, 2012

(30) Foreign Application Priority Data

Sep. 30, 2010 (JP) ................................. 2010-222228

(51) Int. Cl.
*H01P 5/12* (2006.01)

(52) U.S. Cl.
USPC ............................ 333/132; 333/126; 333/129

(58) Field of Classification Search
USPC .................................. 333/125, 126, 129, 132
See application file for complete search history.

(56) References Cited

U.S. PATENT DOCUMENTS 6,714,101 B2 * 3/2004 Kim et al. ..................... 333/177
7,463,115 B2 * 12/2008 Okuyama ..................... 333/126

FOREIGN PATENT DOCUMENTS

| CN | 101694804 A | 4/2010 |
|---|---|---|
| EP | 1 734 609 A1 | 12/2006 |
| EP | 1 746 654 A2 | 1/2007 |
| JP | 04-159807 A | 6/1992 |
| JP | 2004-281847 A | 10/2004 |
| JP | 2006-352532 A | 12/2006 |

OTHER PUBLICATIONS

Official Communication issued in corresponding Japanese Patent Application No. 2010-222228, mailed on Aug. 28, 2012.

* cited by examiner

*Primary Examiner* — Robert Pascal
*Assistant Examiner* — Kimberly Glenn
(74) *Attorney, Agent, or Firm* — Keating & Bennett, LLP

(57) ABSTRACT

In a branching device, an LPF includes a first inductor arranged such that some conductor layers from among conductor layers are wound in a clockwise direction, and a second inductor arranged such that a conductor layer from among the conductor layers is wound in an counterclockwise direction. In addition, an HPF includes a third inductor arranged such that conductor layers are wound in the same clockwise direction as the first inductor. Therefore, when a high-frequency signal passes through the LPF, a winding direction is reversed. In addition, when a high-frequency signal passes through the HPF, a winding direction is reversed.

9 Claims, 24 Drawing Sheets

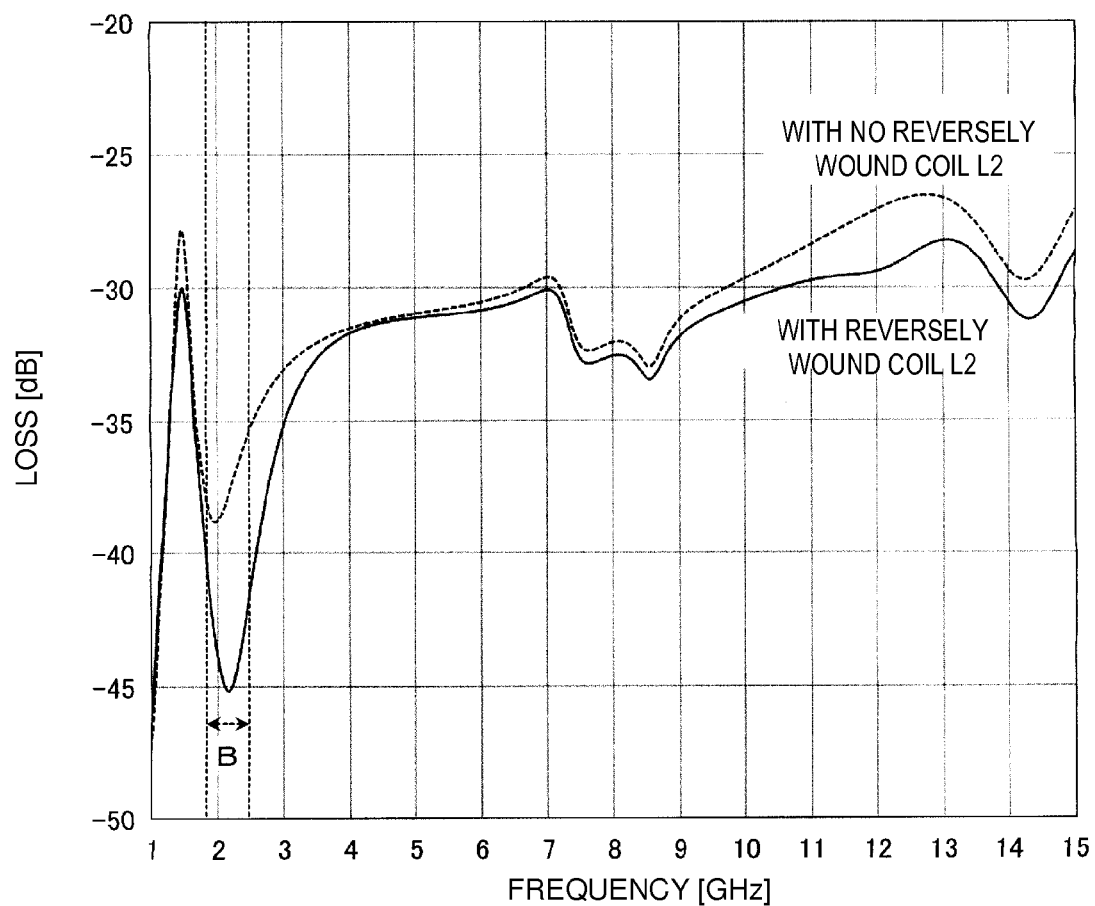

BRANCHING DEVICE

BACKGROUND OF THE INVENTION

1. Field of the Invention

This invention relates to a branching device to process high-frequency signals in a plurality of frequency bands.

2. Description of the Related Art

In recent years, as a technique allowing a network to be easily established, a wireless LAN in which a LAN is established using radio waves has been developed. In the wireless LAN, there are a plurality of standards, such as IEEE802.11b, in which a 2.4 GHz band is used as a frequency band and IEEE802.11a in which a 5 GHz band is used as a frequency band. Therefore, a communication device used for the wireless LAN incorporates a branching device that is connected to an antenna and processes high-frequency signals in a plurality of frequency bands.

For example, in Japanese Unexamined Patent Application Publication No. 2006-352532, a branching device (high-frequency module) is disclosed that includes a first diplexer on a receiving side, a second diplexer on a transmitting side, and one switch circuit. In this branching device, the switch circuit switches to and connects one of the first and second diplexers to one antenna. The first diplexer on the receiving side includes a first band pass filter allowing a high-frequency signal within a predetermined frequency band to pass therethrough. The second diplexer on the receiving side includes a second band pass filter allowing a high-frequency signal within a predetermined frequency band to pass therethrough. The first and second band pass filters are configured in a laminated substrate in which a dielectric layer on which a conductor pattern is formed is laminated.

FIG. 1A is a plan view illustrating the top surface of a twelfth dielectric layer 612 in the laminated substrate in Japanese Unexamined Patent Application Publication No. 2006-352532, FIG. 1B is a plan view illustrating the top surface of a thirteenth dielectric layer 613 in the laminated substrate in Japanese Unexamined Patent Application Publication No. 2006-352532, and FIG. 1C a plan view illustrating the top surface of a fourteenth dielectric layer 614 in the laminated substrate in Japanese Unexamined Patent Application Publication No. 2006-352532.

A conductor layer 739 illustrated in FIG. 1A is connected to a conductor layer 740 illustrated in FIG. 1B through a via hole. In addition, the conductor layer 740 illustrated in FIG. 1B is also connected to a conductor layer 741 illustrated in FIG. 1C through a via hole. Accordingly, the conductor layers 739 to 741 illustrated in FIG. 1A to FIG. 1C define an inductor L7 included in the first band pass filter on the receiving side.

In the same manner, a conductor layer 839 illustrated in FIG. 1A is connected to a conductor layer 840 illustrated in FIG. 1B through a via hole. In addition, the conductor layer 840 illustrated in FIG. 1B is also connected to a conductor layer 841 illustrated in FIG. 1C through a via hole. Accordingly, the conductor layers 839 to 841 illustrated in FIG. 1A to FIG. 1C define an inductor L8 included in the second band pass filter on the transmitting side.

However, when a high-frequency signal passes through the first band pass filter on the receiving side, a magnetic field occurs in the inductor L7. Therefore, the magnetic field interferes with the inductor L8 in the second band pass filter. In the same manner, when a high-frequency signal passes through the second band pass filter on the transmitting side, a magnetic field occurs in the inductor L8. Therefore, the magnetic field interferes with the inductor L7 in the first band pass filter. In particular, in Japanese Unexamined Patent Application Publication No. 2006-352532, since the inductor L7 and the inductor L8 are disposed on a same dielectric layer, unnecessary interference due to mutual magnetic fields may easily occur.

Therefore, in a branching device, it is important for an isolation characteristic between individual LC filter circuits to be improved so that signals passing through the individual LC filter circuits do not cause unnecessary interference with each other (in particular, between transmission and reception). Specifically, in Japanese Unexamined Patent Application Publication No. 2006-352532, in order to reduce electromagnetic interference between the inductors L7 and L8, via electrodes V connected to ground terminals G1 and G4 through a conductor layer 652 are provided between the inductors L7 and L8. However, in this case, a sufficient space to provide the via electrodes V is required between the inductors L7 and L8.

Therefore, in the laminated structure of the branching device in Japanese Unexamined Patent Application Publication No. 2006-352532, there is a problem in that downsizing is difficult while also reducing the electromagnetic interference. Accordingly, when a mobile communication device, such as a mobile phone, includes the branching device according to Japanese Unexamined Patent Application Publication No. 2006-352532, a problem occurs in that the size of the mobile communication device is increased.

SUMMARY OF THE INVENTION

To overcome the problems described above, preferred embodiments of the present invention provide a branching device having reduced electromagnetic interference between individual LC filter circuits and including a laminated structure allowing downsizing thereof to be easily performed.

According to a preferred embodiment of the present invention, a branching device preferably includes an antenna terminal connected to an antenna, at least two signal terminals, a first LC filter circuit being connected between the antenna terminal and each of the signal terminals and allowing a signal in a first frequency band from among signals input from one of the terminals to pass therethrough, and a second LC filter circuit being connected between the antenna terminal and each of the signal terminals and allowing a signal in a second frequency band from among signals input from one of the terminals to pass therethrough, wherein the first LC filter circuit and the second LC filter circuit are provided in a laminated substrate in which a dielectric layer on which a conductor pattern is provided are laminated, the first LC filter circuit includes a first inductor arranged such that a portion of a first coil conductor defined by the conductor pattern is wound in a predetermined direction, and a second inductor arranged such that a remaining portion of the first coil conductor defined by the conductor pattern is wound in a direction opposite to the predetermined direction, and the second LC filter circuit includes a third inductor arranged such that a second coil conductor defined by the conductor pattern is wound in the predetermined direction.

In this structure, when a high-frequency signal passes through the first LC filter circuit, a winding direction is reversed. Therefore, unnecessary coupling is not likely to occur between the second inductor and the third inductor. In addition, when a high-frequency signal passes through the second LC filter circuit, unnecessary coupling is not likely to occur between the third inductor and the second inductor for the same reason.

Accordingly, electromagnetic interference between the first LC filter circuit and the second LC filter circuit is effectively reduced. In addition, since it is not necessary to provide a space between the second inductor and the third inductor as in Japanese Unexamined Patent Application Publication No. 2006-352532 (refer to FIG. 1A to FIG. 1C), the size of the branching device can be significantly reduced.

At least a portion of the third inductor is preferably defined by a winding disposed on the same dielectric layer as the second inductor.

When two inductors are configured such that conductor patterns wind in the same direction on the same dielectric layer, electromagnetic interference between the two inductors is strong.

According to the present preferred embodiment, the winding directions of the conductor patterns of the second and third inductors disposed on the same dielectric layer are opposite to each other. Therefore, when a high-frequency signal passes through the first LC filter circuit, unnecessary coupling is not likely to occur between the second inductor and the third inductor. In addition, when a high-frequency signal passes through the second LC filter circuit, unnecessary coupling is not likely to occur between the third inductor and the second inductor for the same reason.

Accordingly, it is possible to further reduce electromagnetic interference between the first LC filter circuit and the second LC filter circuit according to preferred embodiments of the present invention.

The inductance value of the second inductor is preferably less than that of the first inductor.

In this laminated structure, the following functional effect occurs when the inductance value of the second inductor is less than the inductance value of the first inductor. When the high-frequency signal passes through the first LC filter circuit, the influences of the oppositely wound second inductor on the pass characteristic of the high-frequency signal in the first LC filter circuit and the high-frequency noise removal characteristic thereof are extremely small and may be negligible.

The first LC filter circuit is preferably a filter circuit that allows the signal in the first frequency band from among signals input from the terminal to pass therethrough and outputs the signal to the antenna terminal, and the second LC filter circuit is preferably a filter circuit that allows the signal in the second frequency band from among signals received by the antenna terminal and input from the antenna terminal to pass therethrough and outputs the signal to the signal terminal.

In this laminated structure, the first LC filter circuit is a filter circuit on a transmitting side, and the second LC filter circuit is a filter circuit on a receiving side. Therefore, according to this laminated structure, it is possible to reduce electromagnetic interference between the first LC filter circuit on the transmitting side and the second LC filter circuit on the receiving side.

The first LC filter circuit is preferably a filter circuit that allows the signal in the first frequency band from among signals received by the antenna terminal and input from the antenna terminal to pass therethrough and outputs the signal to the signal terminal, and the second LC filter circuit is preferably a filter circuit that allows the signal in the second frequency band from among signals input from the terminal to pass therethrough and outputs the signal to the antenna terminal.

In this laminated structure, the first LC filter circuit is a filter circuit on the receiving side, and the second LC filter circuit is a filter circuit on the transmitting side. Therefore, according to this laminated structure, it is possible to reduce electromagnetic interference between the first LC filter circuit on the receiving side and the second LC filter circuit on the transmitting side.

The first frequency band is preferably the same or substantially the same frequency band as the second frequency band.

When the first and second frequency bands are the same or substantially the same as each other, electromagnetic interference between the first and second LC filter circuits is particularly strong. Therefore, in this structure, it is possible to further reduce electromagnetic interference between the first LC filter circuit and the second LC filter circuit.

According to various preferred embodiments of the present invention, it is possible to provide a branching device having reduced electromagnetic interference between individual LC filter circuits and that enables downsizing thereof to be easily performed.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 24 is a characteristic diagram illustrating an isolation characteristic of the branching device according to a preferred embodiment of the present invention and an isolation characteristic of an example of a modification to the branching device.

DETAILED DESCRIPTION OF THE PREFERRED EMBODIMENTS

Hereinafter, a branching device according to preferred embodiments of the present invention will be described. The branching device according to a preferred embodiment of the present invention is used for communication using a wireless LAN. The branching device processes a first reception signal and a first transmission signal in a first frequency band and a second reception signal and a second transmission signal in a second frequency band that is located on a high-frequency wave side with respect to the first frequency band in this preferred embodiment. For example, the first frequency band is a 2.4 GHz band used in IEEE802.11b. For example, the second frequency band is a 5 GHz band used in IEEE802.11a. In addition, at the time of implementation, in addition to the first and second frequency bands, a circuit configuration in which a high-frequency signal in another frequency band is processed may be added to the branching device.

First, the configuration of a high-frequency circuit unit in a communication device used for a wireless LAN, in which the branching device according to a preferred embodiment of the present invention is mounted will be described.

Figure 2:
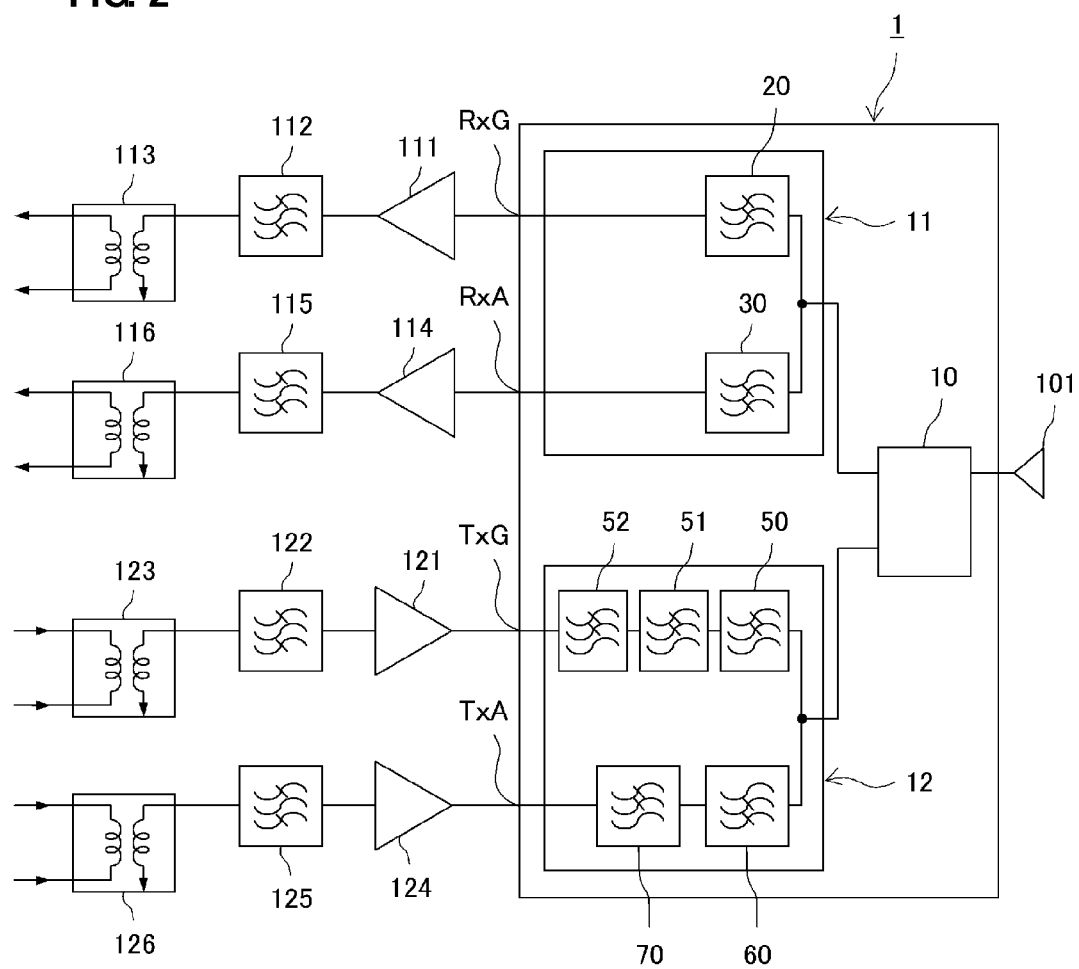
FIG. 2 is a block diagram illustrating a configuration of a high-frequency circuit unit in a communication device used for a wireless LAN, in which a branching device according to a preferred embodiment of the present invention is mounted.

FIG. 2 is a block diagram illustrating the configuration of the high-frequency circuit unit. The high-frequency circuit unit preferably includes a branching device 1 and an antenna 101 connected to the branching device 1.

The high-frequency circuit unit preferably further includes a low noise amplifier 111 including an input end portion that is connected to a reception signal terminal RxG of the branching device 1, a band pass filter (hereinafter, described as BPF) 112 including one end portion that is connected to an output end portion of the low noise amplifier 111, and a balun 113 including an unbalanced terminal that is connected to the other end portion of the BPF 112. After being amplified by the low noise amplifier 111, a first reception signal output from the reception signal terminal RxG passes through the BPF 112, is converted into a balanced signal by the balun 113, and is output from two balanced terminals of the balun 113.

The high-frequency circuit unit preferably further includes a low noise amplifier 114 including an input end portion that is connected to a reception signal terminal RxA of the branching device 1, a BPF 115 including one end portion that is connected to an output end portion of the low noise amplifier 114, and a balun 116 including an unbalanced terminal that is connected to the other end portion of the BPF 115. After being amplified by the low noise amplifier 114, a second reception signal output from the reception signal terminal RxA passes through the BPF 115, is converted into a balanced signal by the balun 116, and is output from two balanced terminals of the balun 116.

The high-frequency circuit unit preferably further includes a power amplifier 121 including an output end portion that is connected to a transmission signal terminal TxG of the branching device 1, a BPF 122 including one end portion that is connected to the input end of the power amplifier 121, and a balun 123 including an unbalanced terminal that is connected to the other end portion of the BPF 122. A balanced signal corresponding to the first transmission signal is input to two balanced terminals of the balun 123, is converted into an unbalanced signal by the balun 123, passes through the BPF 122, and, after being amplified by the power amplifier 121, is transmitted, as the first transmission signal, to the transmission signal terminal TxG.

The high-frequency circuit unit preferably further includes a power amplifier 124 including an output end portion that is connected to a transmission signal terminal TxA of the branching device 1, a BPF 125 including one end portion that is connected to the input end of the power amplifier 124, and a balun 126 including an unbalanced terminal that is connected to the other end portion of the BPF 125. A balanced signal corresponding to the second transmission signal is input to two balanced terminals of the balun 126, is converted into an unbalanced signal by the balun 126, passes through the BPF 125, and, after being amplified by the power amplifier 124, is transmitted, as the second transmission signal, to the transmission signal terminal TxA.

In addition, the configuration of the high-frequency circuit unit is not limited to the configuration illustrated in FIG. 2, and various modifications may be adopted. For example, the high-frequency circuit unit may have a configuration in which the baluns 113 and 116 are not included and a signal that has passed through the BPFs 112 and 115 is output with remaining unbalanced signals.

In addition, a positional relationship between the low noise amplifier 111 and the BPF 112 and a positional relationship between the low noise amplifier 114 and the BPF 115 may be opposite to the positional relationships illustrated in FIG. 2, respectively. In addition, in place of the BPFs 112, 115, 122, and 125, low-pass filters or high-pass filters may be provided.

Next, the configuration of the branching device 1 according to a preferred embodiment of the present invention will be described.

Figure 3:
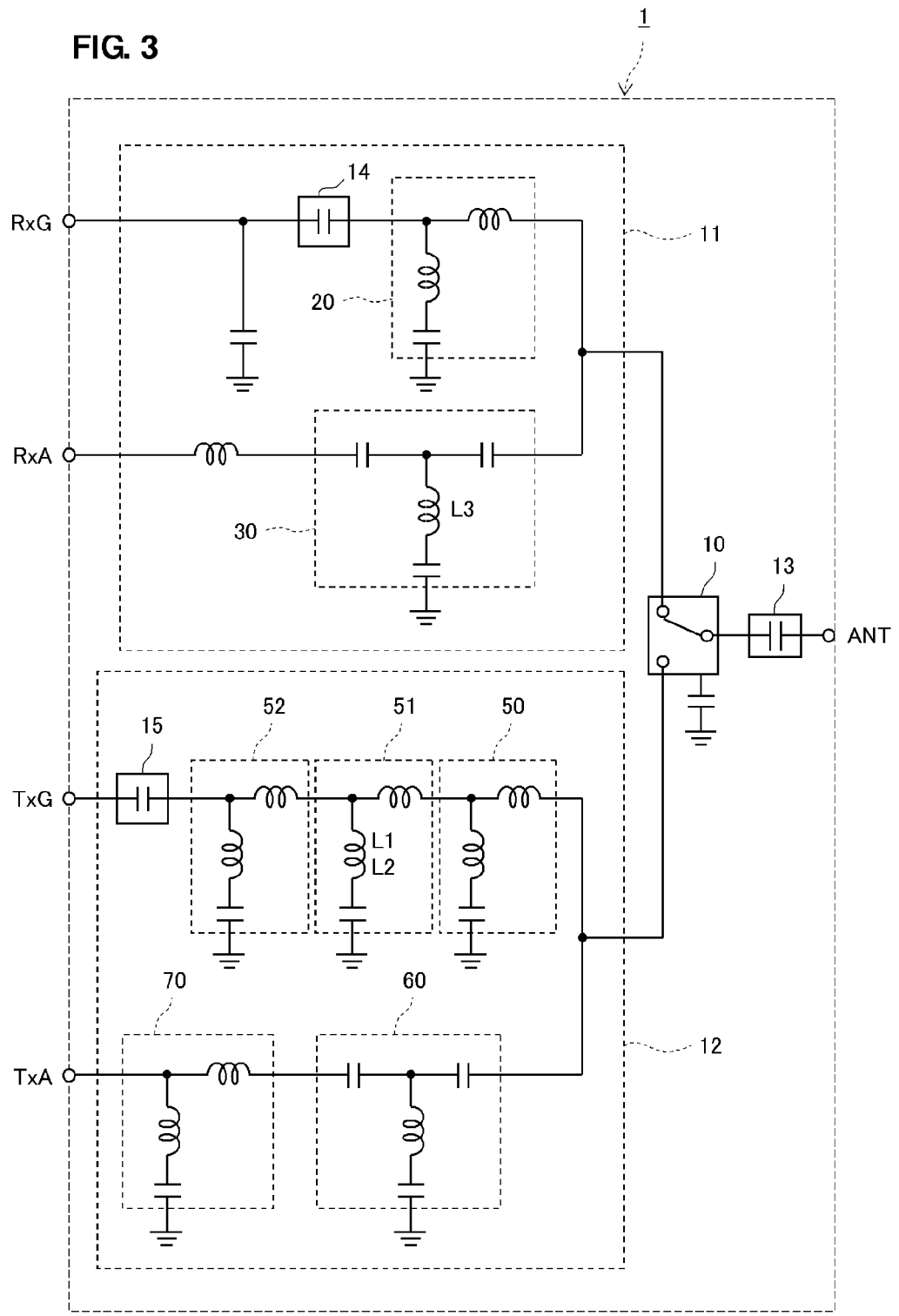
FIG. 3 is a circuit diagram of the branching device according to a preferred embodiment of the present invention.

FIG. 3 is a circuit diagram illustrating the branching device 1 according to a preferred embodiment of the present invention. The branching device 1 preferably includes an antenna terminal ANT connected to the antenna 101, the first reception signal terminal RxG arranged to output the first reception signal in the first frequency band, the second reception signal terminal RxA arranged to output the second reception signal in the second frequency band, the first transmission signal terminal TxG to which the first transmission signal in the first frequency band is input, and the second transmission signal terminal TxA to which the second transmission signal in the second frequency band is input.

The branching device 1 preferably further includes a switch circuit 10 connected to the antenna terminal ANT, a first diplexer 11 connected to the reception signal terminals RxG and RxA and the switch circuit 10, and a second diplexer 12 connected to the transmission signal terminals TxG and TxA and the switch circuit 10.

The switch circuit 10 is preferably connected to the antenna terminal ANT through a capacitor 13 used to remove a direct-current component. In addition, the switch circuit 10 is connected to the diplexer 11 and the diplexer 12. In addition, the switch circuit 10 is connected to ground through a capacitor. Furthermore, the switch circuit 10 is connected to a control circuit not illustrated. The switch circuit 10 changes over a switch based on a switching signal from the control circuit, and connects one of the diplexer 11 and the diplexer 12 and the antenna terminal ANT to each other.

The diplexer 11 preferably includes a low-pass filter (hereinafter, also described as LPF) 20 and a high-pass filter (hereinafter, also described as HPF) 30 including an inductor L3 whose detail will be described below. One end portion of the LPF 20 is connected to the switch circuit 10. The other end portion of the LPF 20 is connected to the reception signal terminal RxG through a capacitor 14. On the other hand, one end portion of the HPF 30 is connected to the switch circuit 10. The other end portion of the HPF 30 is connected to the reception signal terminal RxA through an inductor.

The LPF 20 allows a reception signal within the first frequency (for example, a wireless signal in a 2.4 GHz band) band to pass therethrough and blocks out a reception signal on a high-frequency side out of the first frequency band. Accordingly, the LPF 20 subjects the reception signal being input to the antenna terminal ANT and passing through the switch circuit 10 to filtering, and outputs the first reception signal to the reception signal terminal RxG.

The HPF 30 allows a reception signal within the second frequency (for example, a wireless signal in a 5 GHz band) band to pass therethrough, and blocks out a reception signal on a low-frequency side out of the second frequency band. Accordingly, the LPF 30 subjects the reception signal being input to the antenna terminal ANT and passing through the switch circuit 10 to filtering, and outputs the reception signal to the second reception signal terminal RxA.

The diplexer 12 includes three LPFs 50, 51, and 52 connected in series to one another, an HPF 60, and an LPF 70. One end portion of the LPF 50 is connected to the switch circuit 10. The LPF 51 includes inductors L1 and L2 whose details will be described below, one end portion thereof is connected to the other end portion of the LPF 50, and the other end portion thereof is connected to one end portion of the LPF 52. The other end portion of the LPF 52 is connected to the transmission signal terminal TxG through a capacitor 15. On the other hand, one end portion of the HPF 60 is connected to the switch circuit 10. The other end portion of the HPF 60 is connected to one end of the LPF 70. The other end portion of the LPF 70 is connected to the transmission signal terminal TxA.

The LPFs 50, 51, and 52 allow a transmission signal within the first frequency band to pass therethrough, and block out a transmission signal out of the first frequency band. When describing in detail, the LPF 52 preferably blocks out the third harmonic wave of the first transmission signal. In addition, the LPFs 50 and 51 preferably block out the second harmonic wave of the first transmission signal. Accordingly, the LPFs 50, 51, and 52 subject a transmission signal input to the transmission signal terminal TxG to filtering, and output the first transmission signal to the switch circuit 10.

The HPF 60 and the LPF 70 allow a transmission signal within the second frequency band to pass therethrough, and block out a transmission signal out of the second frequency band. When describing in detail, the LPF 70 preferably blocks out the second and third harmonic waves of the second transmission signal. In addition, the HPF 60 preferably blocks out a transmission signal on a low-frequency side with respect to the second frequency band. Accordingly, the HPF 60 and LPF 70 subject a transmission signal input to the transmission signal terminal TxA to filtering, and output the second transmission signal to the switch circuit 10.

In the branching device 1 having the configuration as described above, the reception signal in the first frequency band, input to the antenna terminal ANT, passes through the switch circuit 10 and the LPF 20, and is transmitted, as the first reception signal, to the reception signal terminal RxG. In addition, the reception signal in the second frequency band, input to the antenna terminal ANT, passes through the switch circuit 10 and the HPF 30, and is transmitted, as the second reception signal, to the reception signal terminal RxA. In addition, the transmission signal in the first frequency band, input to the transmission signal terminal TxG, passes through the LPFs 50 to 52 and the switch circuit 10, and is transmitted to the antenna terminal ANT. In addition, the transmission signal in the second frequency band, input to the transmission signal terminal TxA, passes through the LPF 70 and the HPF 60 and the switch circuit 10, and is transmitted to the antenna terminal ANT.

In addition, the LPF 51 corresponds to a "first LC filter circuit" according to a preferred embodiment of the present invention, and the HPF 30 corresponds to a "second LC filter circuit" according to a preferred embodiment of the present invention. In addition, the inductor L1 corresponds to a "first inductor" according to a preferred embodiment of the present invention, the inductor L2 corresponds to a "second inductor" according to a preferred embodiment of the present invention, and the inductor L3 corresponds to a "third inductor" according to a preferred embodiment of the present invention.

Next, the structure of the branching device 1 will be described with reference to FIG. 4 and FIG. 5.

Figure 4:
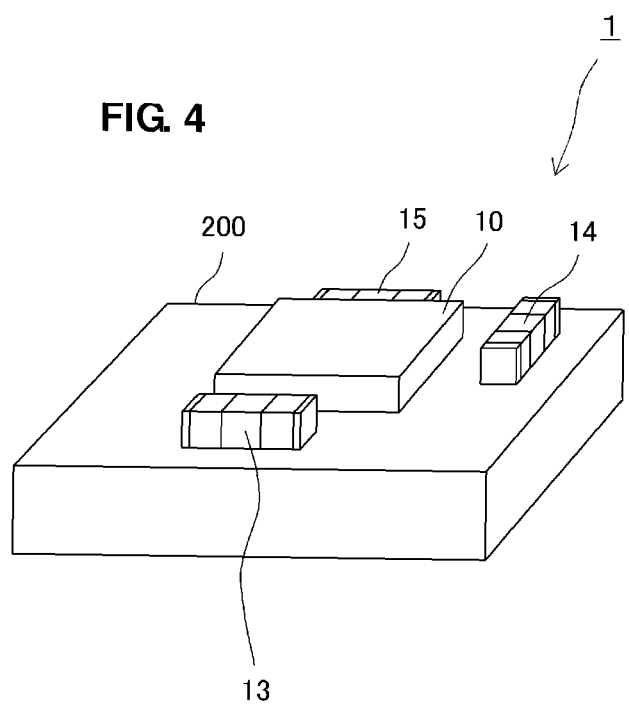
FIG. 4 is an external perspective view of the branching device according to a preferred embodiment of the present invention.
Figure 5:
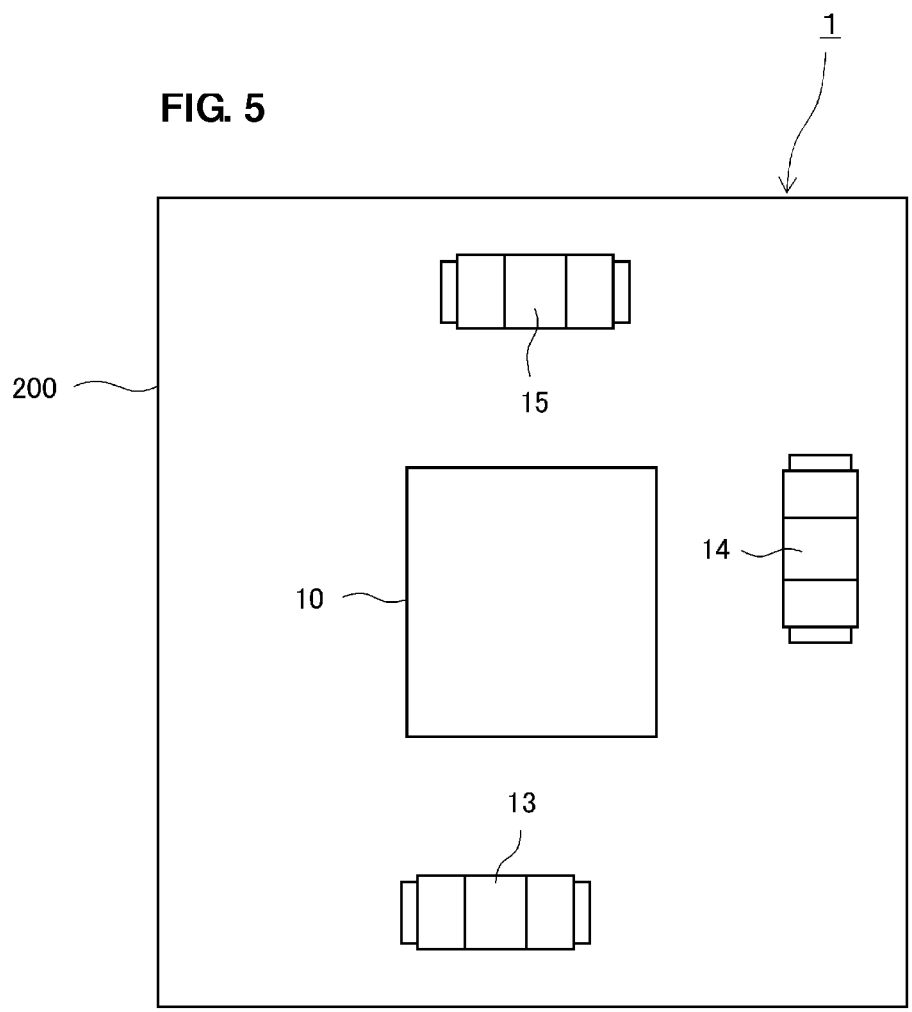
FIG. 5 is a plan view of the branching device according to a preferred embodiment of the present invention.

FIG. 4 is an external perspective view of the branching device 1. FIG. 5 is a plan view of the branching device 1.

The branching device 1 preferably includes a laminated substrate 200 in which the above-mentioned individual elements of the branching device 1 are integrated. The laminated substrate 200 includes dielectric layers and conductor layers that are alternately laminated. A circuit in the branching device 1 is configured using a conductor layer within the laminated substrate 200 or on the surface thereof and elements mounted on the top surface of the laminated substrate 200. Here, the switch circuit 10 and the capacitors 13 to 15, illustrated in FIG. 2 and FIG. 3, are preferably mounted on the laminated substrate 200. The switch circuit 10 is defined by a single component. For example, the laminated substrate 200 is preferably a low-temperature simultaneous firing ceramic multilayer substrate. In addition, the formation of a conductor pattern in each layer of the laminated substrate 200 is preferably performed by a screen printing method utilizing a screen printing plate, for example.

Next, the configuration of the laminated substrate 200 will be described with reference to FIG. 6 to FIG. 23.

Figure 23:
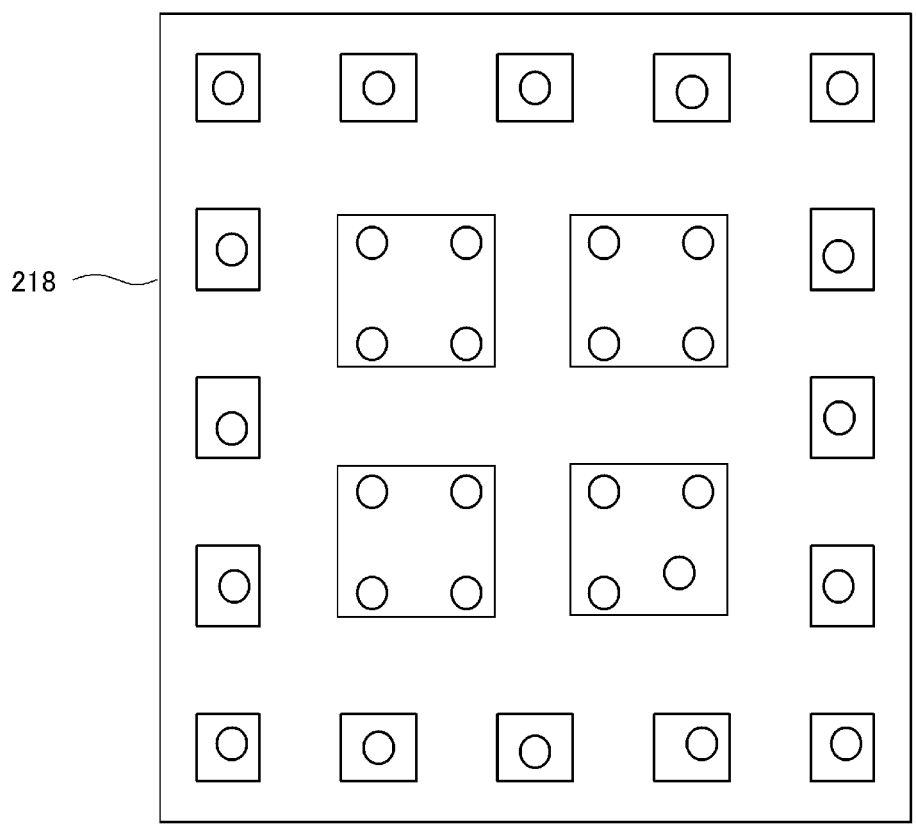
FIG. 23 is a plan view illustrating a bottom surface of an eighteenth dielectric layer in the laminated substrate illustrated in FIG. 4.

FIG. 6 to FIG. 22 individually illustrate the top surfaces of first to seventeenth dielectric layers from the top. FIG. 23 illustrates the bottom surface of an eighteenth dielectric layer from the top. In FIG. 6 to FIG. 23, circles indicate via holes.

Figure 6:
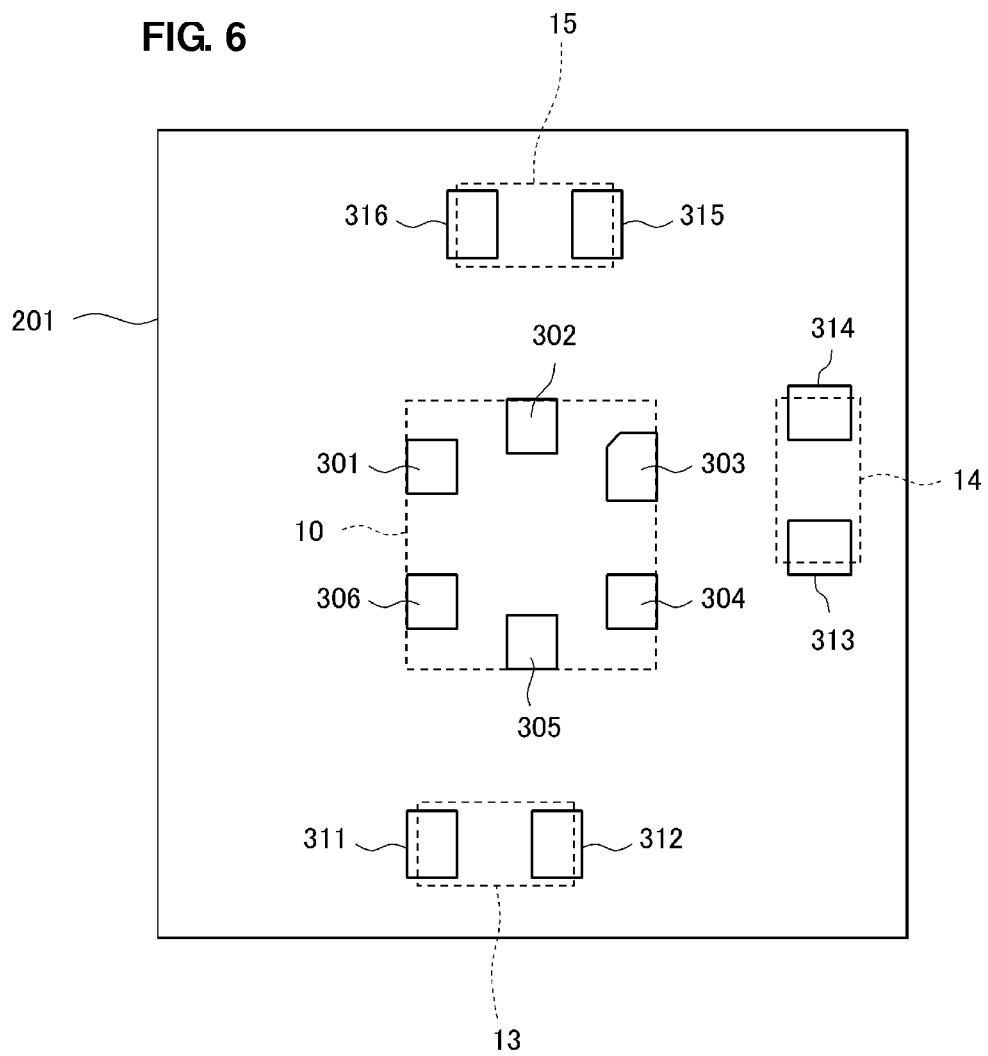
FIG. 6 is a plan view illustrating a top surface of a first dielectric layer in a laminated substrate illustrated in FIG. 4.
Figure 7:
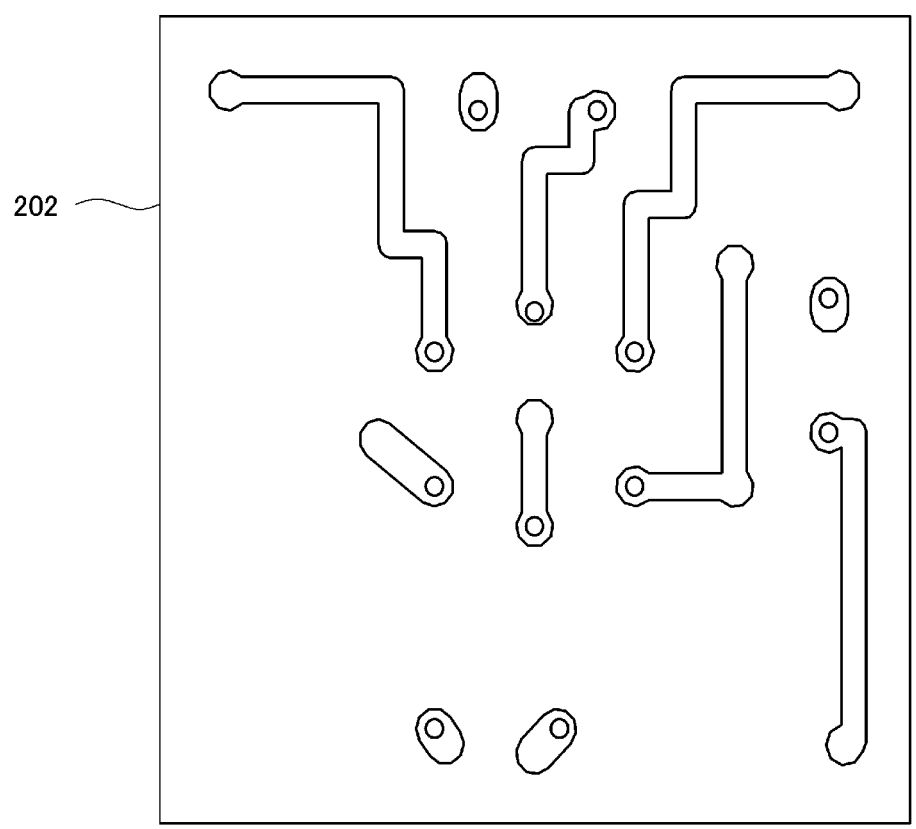
FIG. 7 is a plan view illustrating a top surface of a second dielectric layer in the laminated substrate illustrated in FIG. 4.
Figure 8:
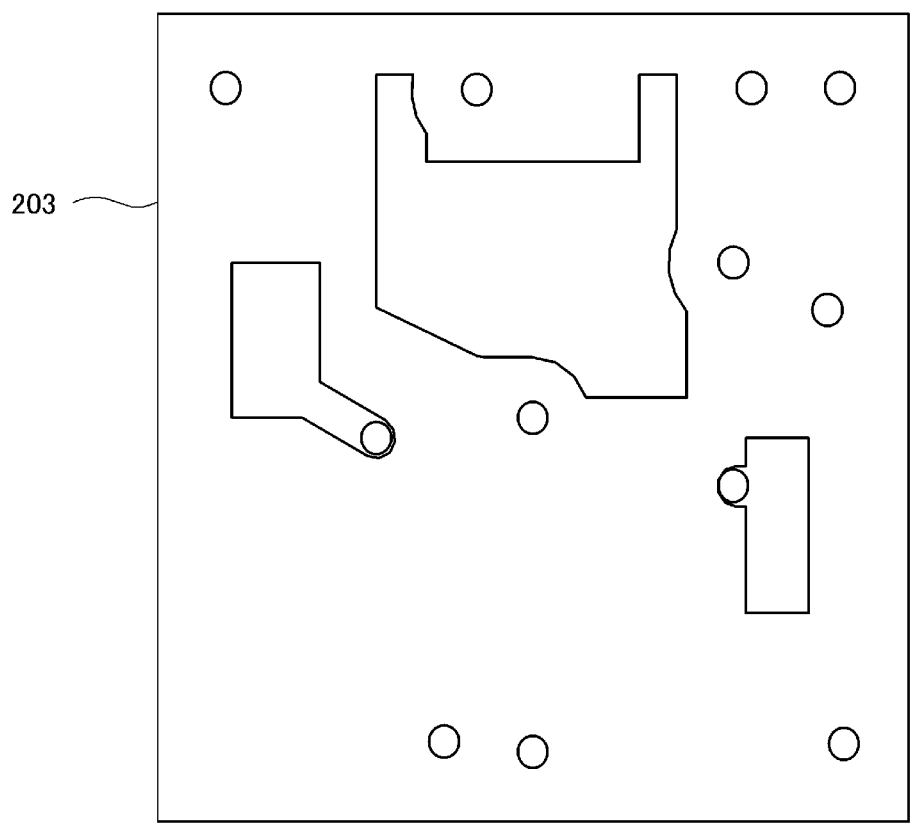
FIG. 8 is a plan view illustrating a top surface of a third dielectric layer in the laminated substrate illustrated in FIG. 4.
Figure 9:
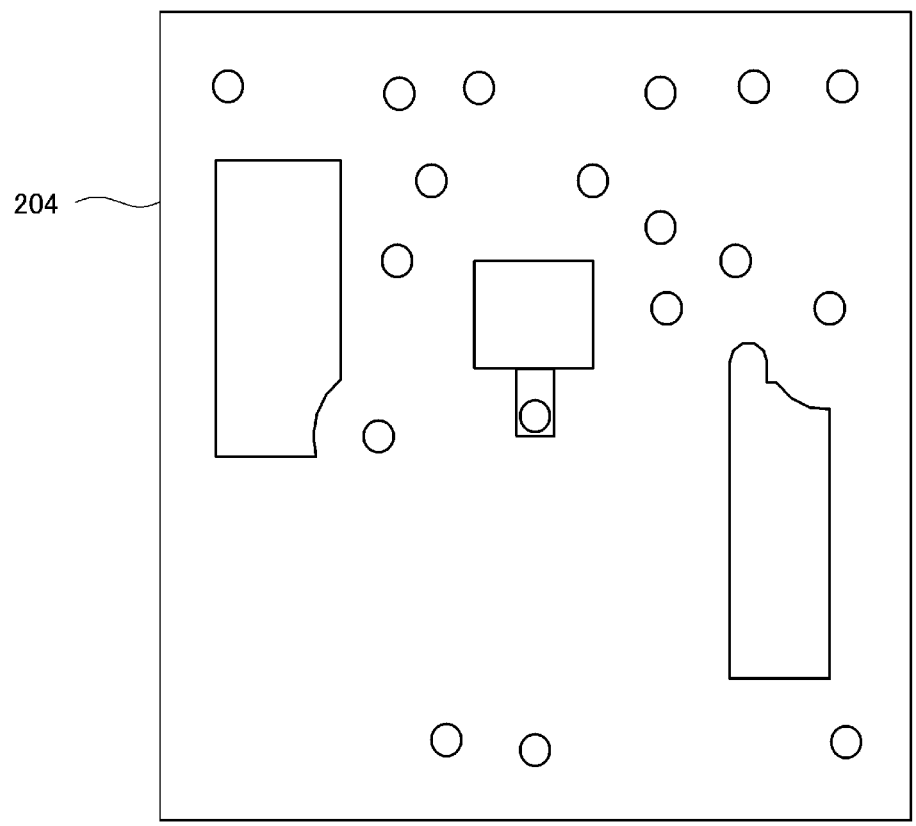
FIG. 9 is a plan view illustrating a top surface of a fourth dielectric layer in the laminated substrate illustrated in FIG. 4.
Figure 10:
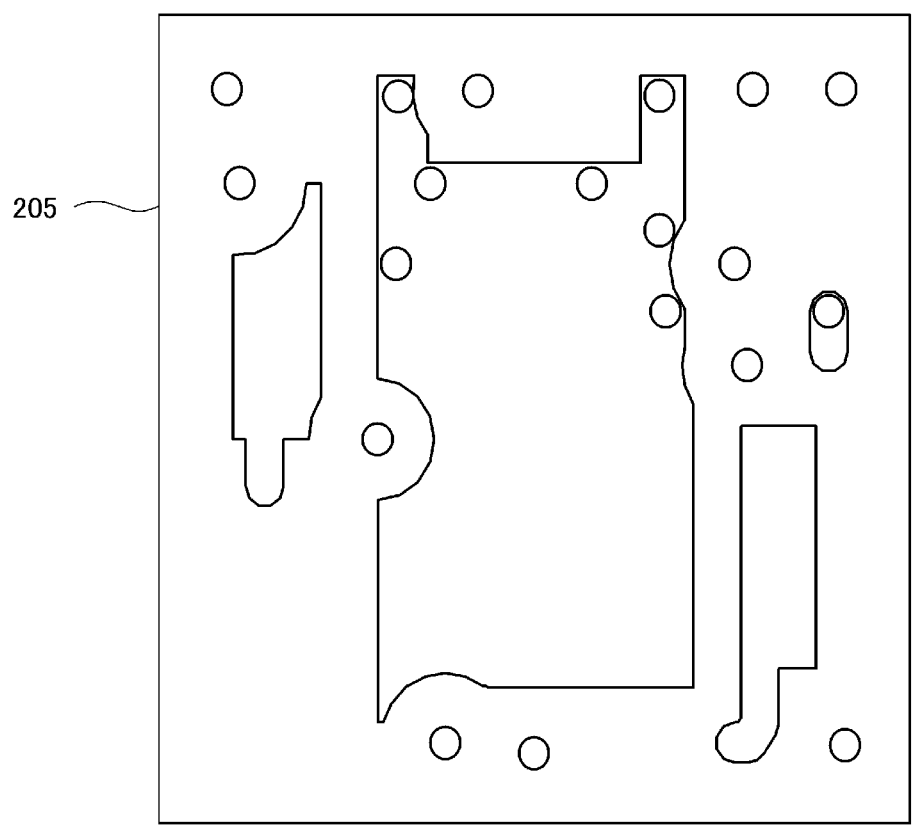
FIG. 10 is a plan view illustrating a top surface of a fifth dielectric layer in the laminated substrate illustrated in FIG. 4.
Figure 11:
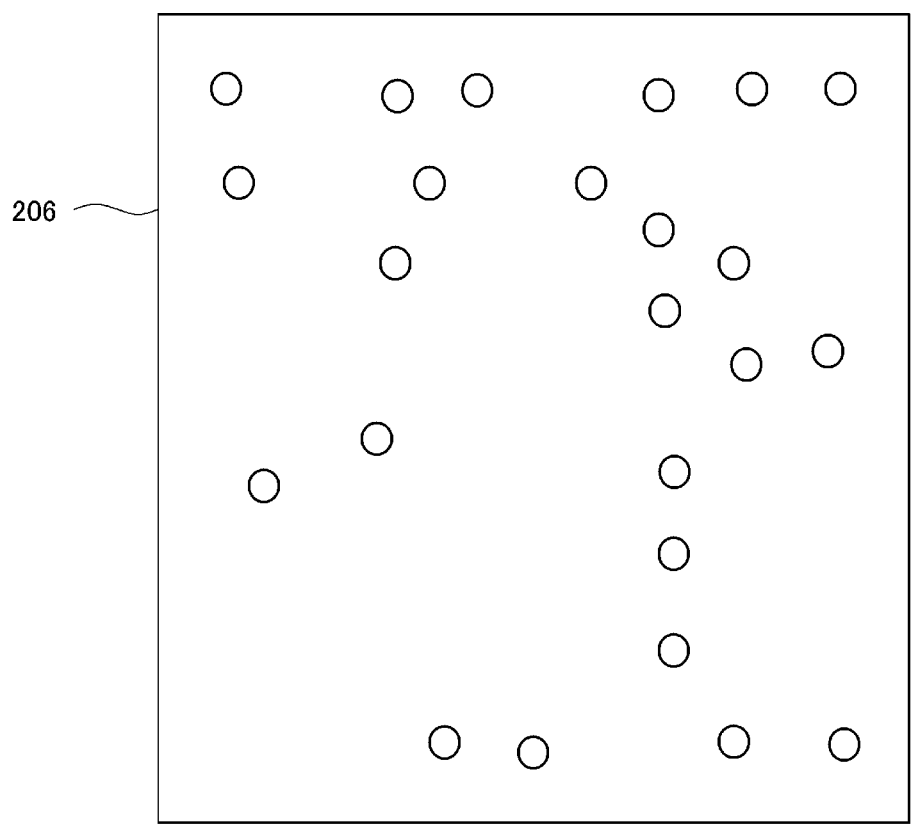
FIG. 11 is a plan view illustrating a top surface of a sixth dielectric layer in the laminated substrate illustrated in FIG. 4.

On the top surface of the first dielectric layer 201 illustrated in FIG. 6, conductor patterns 311 and 312 to which the capacitor 13 is connected, conductor patterns 313 and 314 to which the capacitor 14 is connected, and conductor patterns 315 and 316 to which the capacitor 15 is connected are provided. Furthermore, on the top surface of the dielectric layer 201, six conductor patterns 301 to 306 to which the individual terminals of the switch circuit 10 are connected are provided.

On the top surface of each of the dielectric layers 202 to 217 subsequent to the first layer, illustrated in FIG. 7 to FIG. 22, and on the bottom surface of the dielectric layer 218 illustrated in FIG. 23, conductor layers and via holes are also formed.

The seventh dielectric layer 207 to the twelfth dielectric layer 212 which are are the primary portions of the present preferred embodiment, illustrated in FIG. 12 to FIG. 17, will be described in detail.

Figure 12:
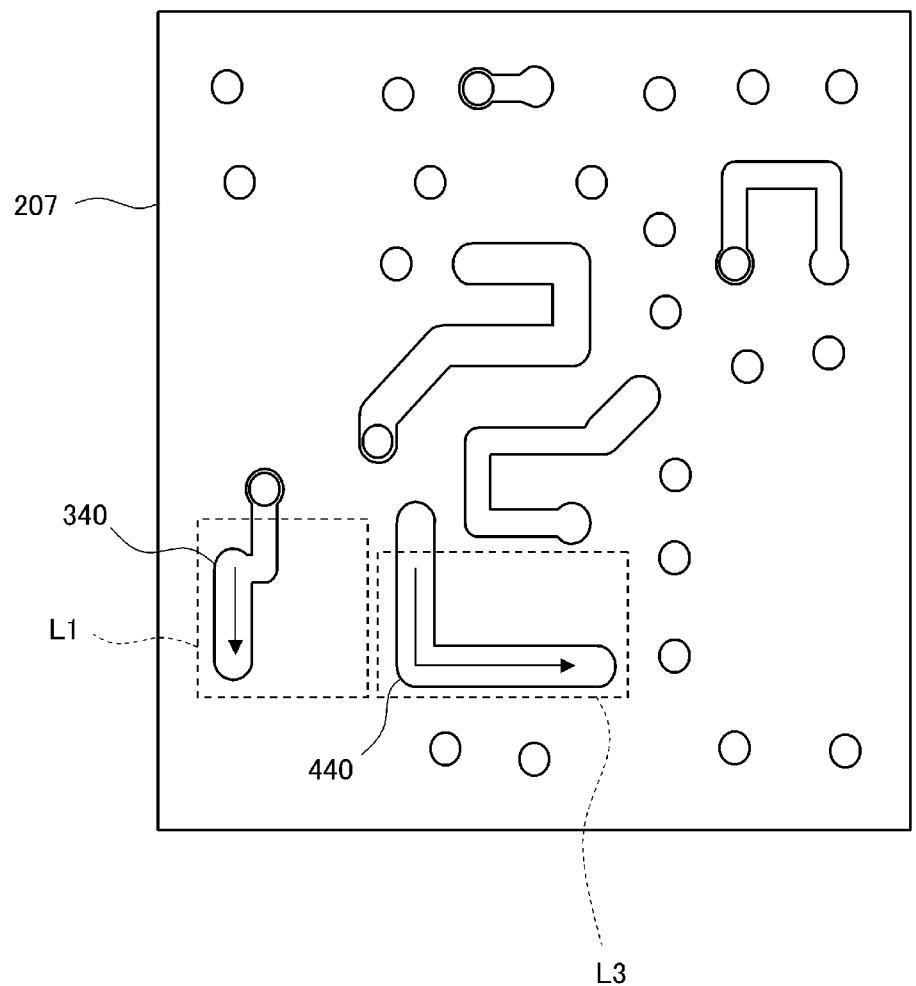
FIG. 12 is a plan view illustrating a top surface of a seventh dielectric layer in the laminated substrate illustrated in FIG. 4.
Figure 13:
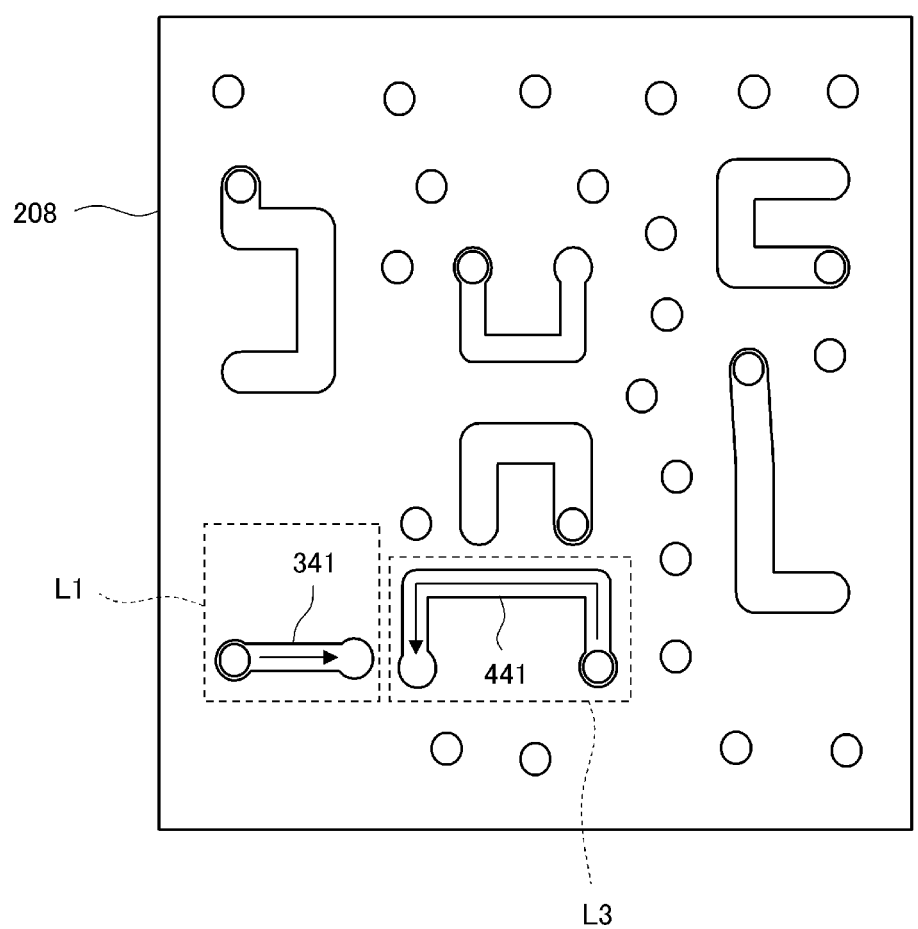
FIG. 13 is a plan view illustrating a top surface of an eighth dielectric layer in the laminated substrate illustrated in FIG. 4.
Figure 14:
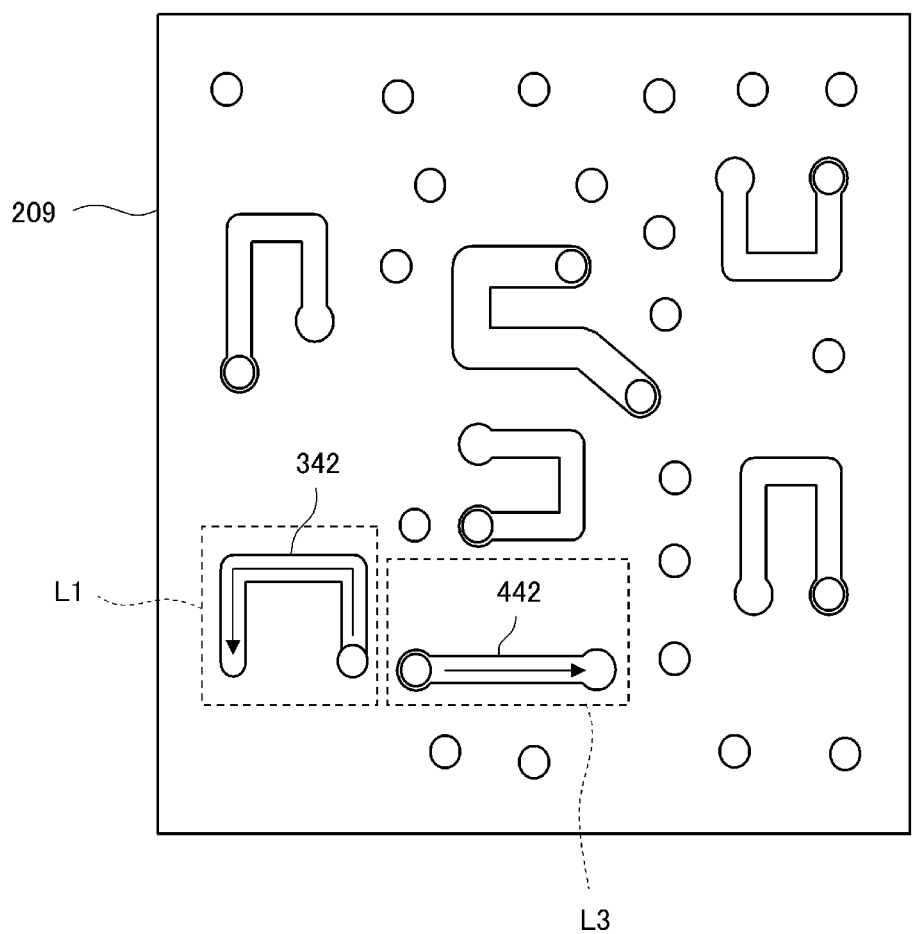
FIG. 14 is a plan view illustrating a top surface of a ninth dielectric layer in the laminated substrate illustrated in FIG. 4.
Figure 15:
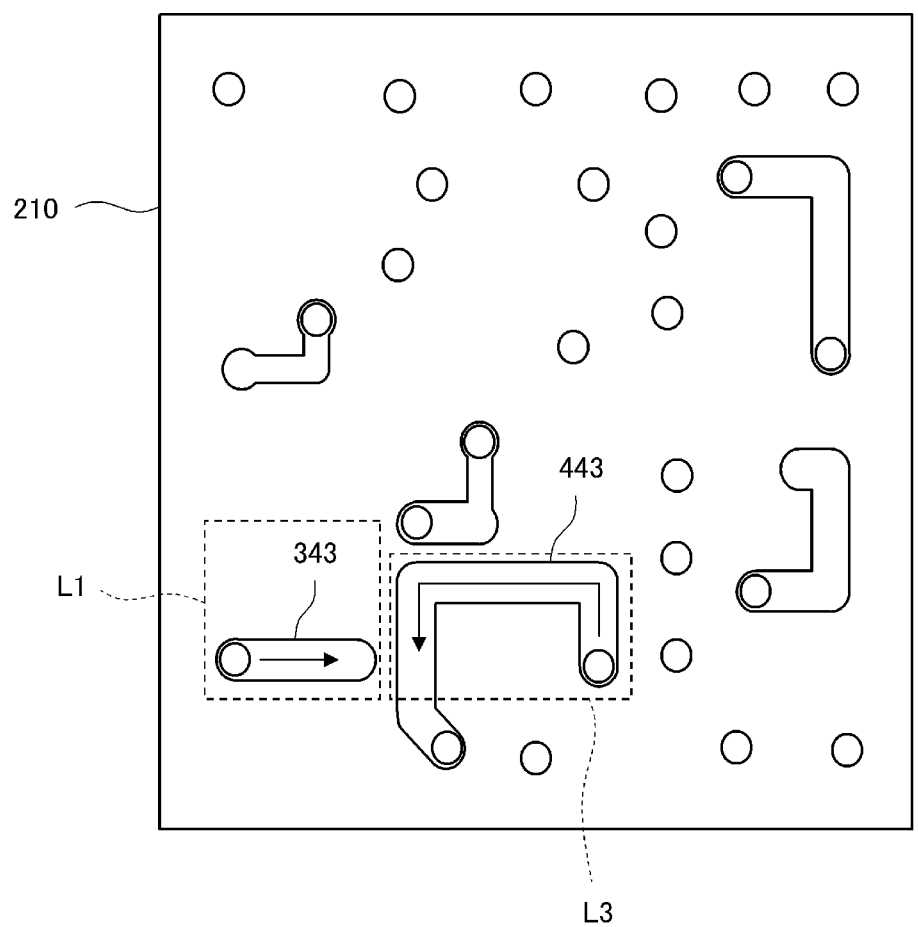
FIG. 15 is a plan view illustrating a top surface of a tenth dielectric layer in the laminated substrate illustrated in FIG. 4.
Figure 16:
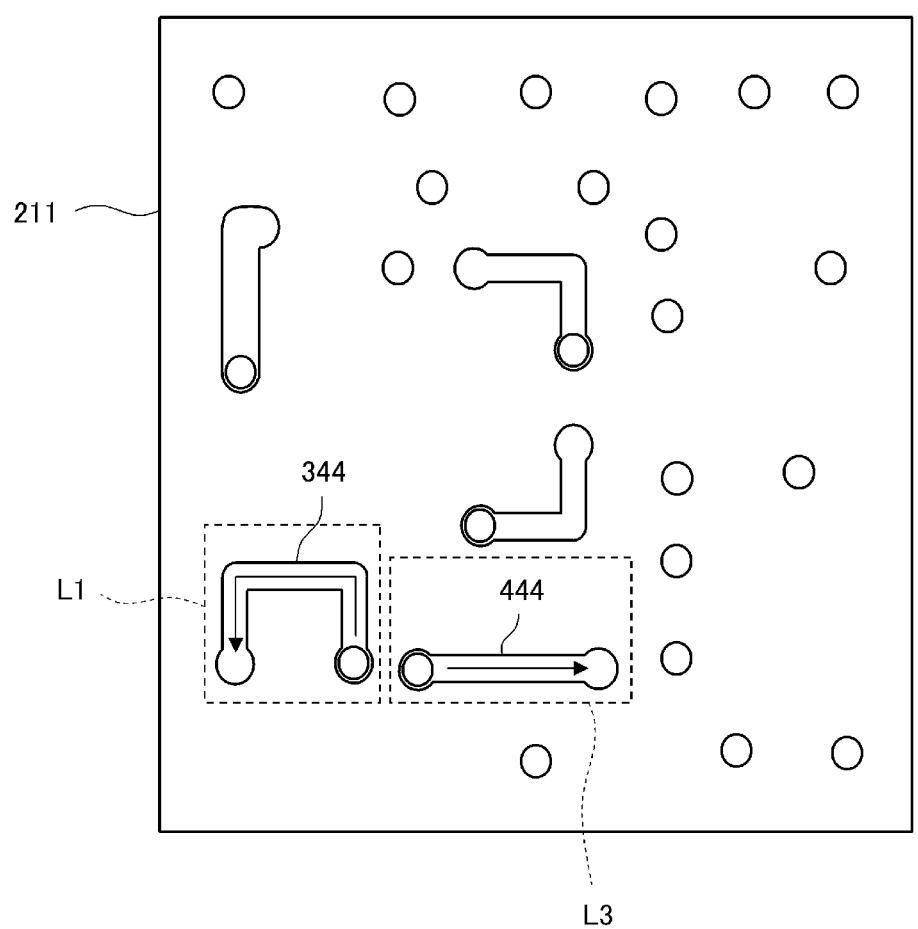
FIG. 16 is a plan view illustrating a top surface of an eleventh dielectric layer in the laminated substrate illustrated in FIG. 4.

Preferably, a conductor layer 440 illustrated in FIG. 12 is connected to a conductor layer 441 illustrated in FIG. 13 through a via hole. In addition, the conductor layer 441 illustrated in FIG. 13 is also connected to a conductor layer 442 illustrated in FIG. 14 through a via hole. Subsequently, in substantially the same manner, conductor layers 442 to 444 illustrated in FIG. 14 to FIG. 16 are also connected to conductor layers 443 to 445 illustrated in FIG. 15 to FIG. 17 through via holes, respectively. Accordingly, the conductor layers 440 to 445 illustrated in FIG. 12 to FIG. 17 define the inductor L3 illustrated in FIG. 3.

On the other hand, preferably, a conductor layer 340 illustrated in FIG. 12 is connected to a conductor layer 341 illustrated in FIG. 13 through a via hole. In addition, the conductor layer 341 illustrated in FIG. 13 is also connected to a conductor layer 342 illustrated in FIG. 14 through a via hole. Subsequently, in substantially the same manner, conductor layers 342 to 344 illustrated in FIG. 14 to FIG. 16 are also connected to conductor layers 343 to 345 illustrated in FIG. 15 to FIG. 17 through via holes, respectively. Accordingly, the conductor layers 340 to 344 illustrated in FIG. 12 to FIG. 16 define the inductor L1 illustrated in FIG. 3. In addition, the conductor layer 345 illustrated in FIG. 17 defines the inductor L2 illustrated in FIG. 3.

In addition, the conductor layers 340 to 345 correspond to a "first coil conductor" according to a preferred embodiment of the present invention, and the conductor layers 440 to 445 correspond to a "second coil conductor" according to a preferred embodiment of the present invention.

Figure 17:
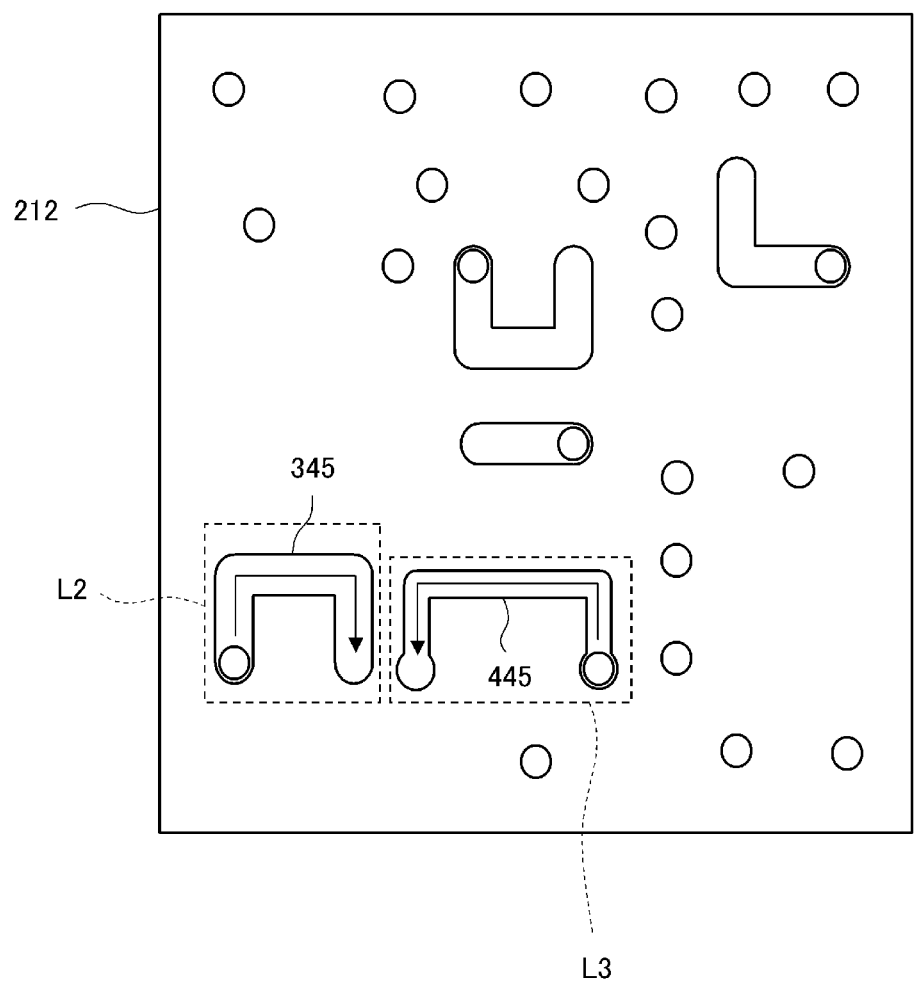
FIG. 17 is a plan view illustrating a top surface of a twelfth dielectric layer in the laminated substrate illustrated in FIG. 4.
Figure 18:
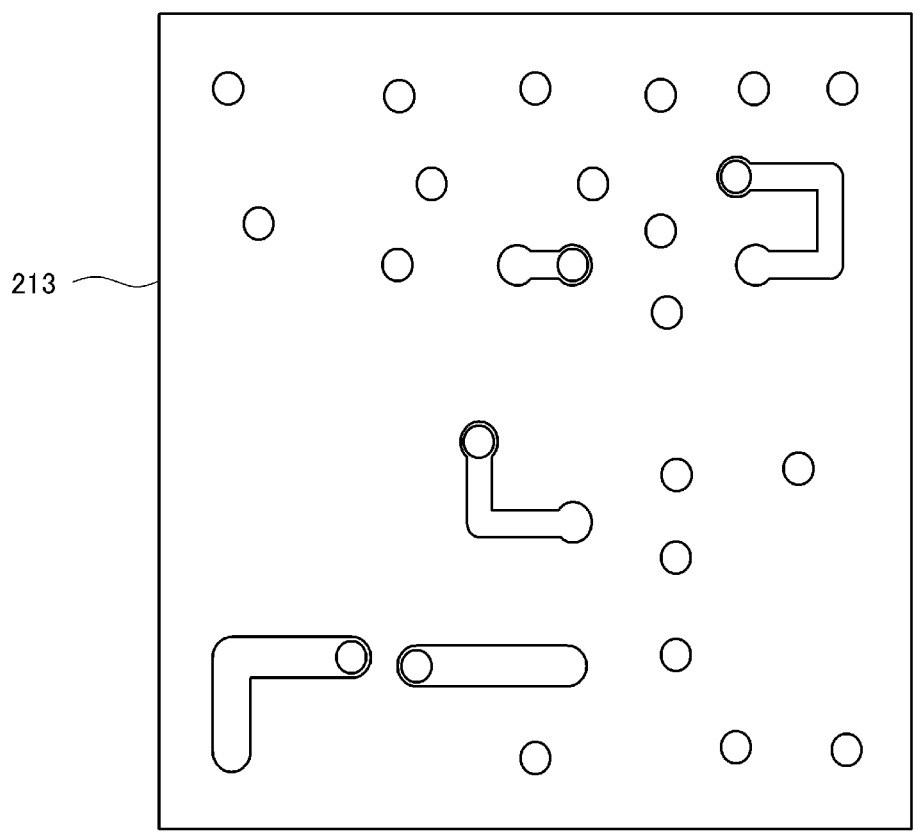
FIG. 18 is a plan view illustrating a top surface of a thirteenth dielectric layer in the laminated substrate illustrated in FIG. 4.
Figure 19:
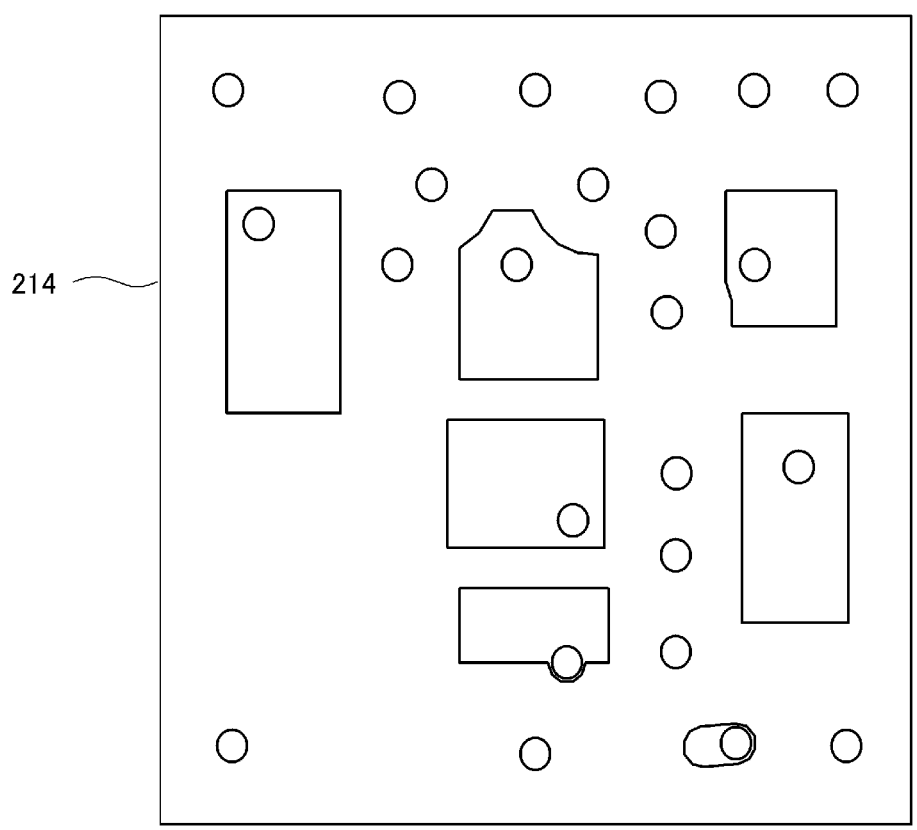
FIG. 19 is a plan view illustrating a top surface of a fourteenth dielectric layer in the laminated substrate illustrated in FIG. 4.
Figure 20:
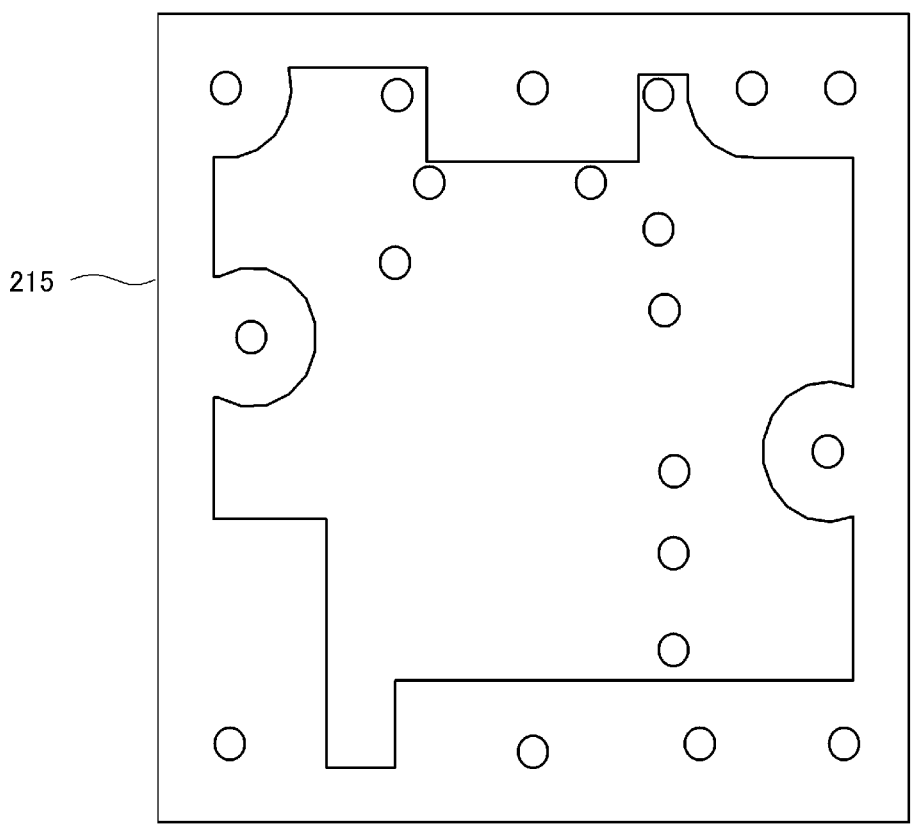
FIG. 20 is a plan view illustrating a top surface of a fifteenth dielectric layer in the laminated substrate illustrated in FIG. 4.
Figure 21:
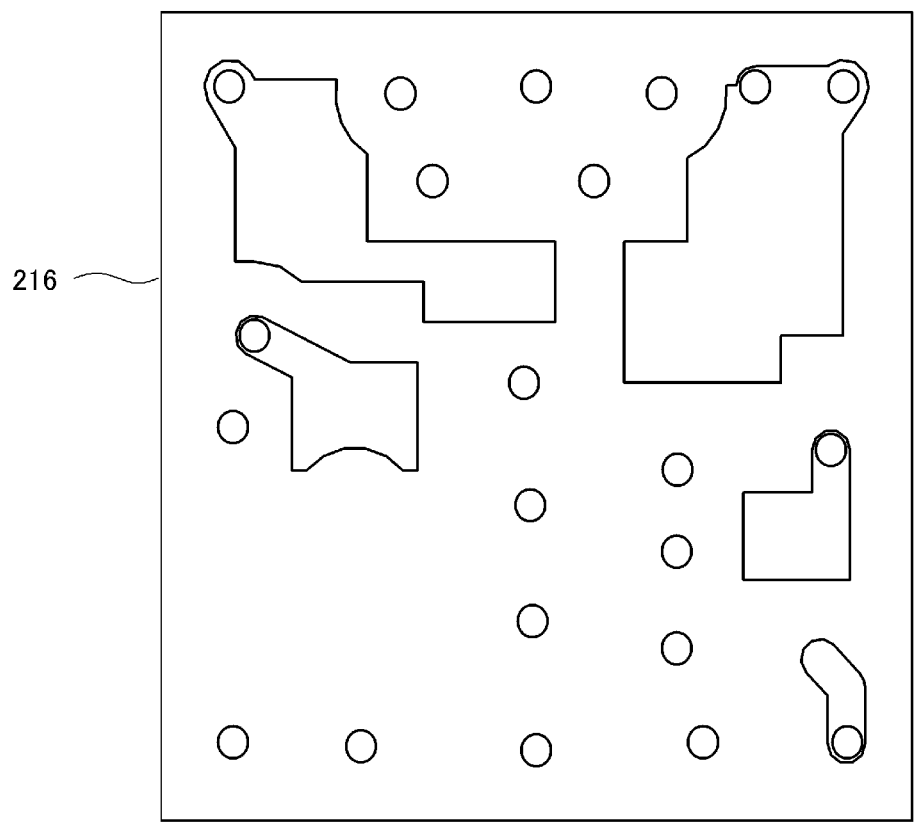
FIG. 21 is a plan view illustrating a top surface of a sixteenth dielectric layer in the laminated substrate illustrated in FIG. 4.
Figure 22:
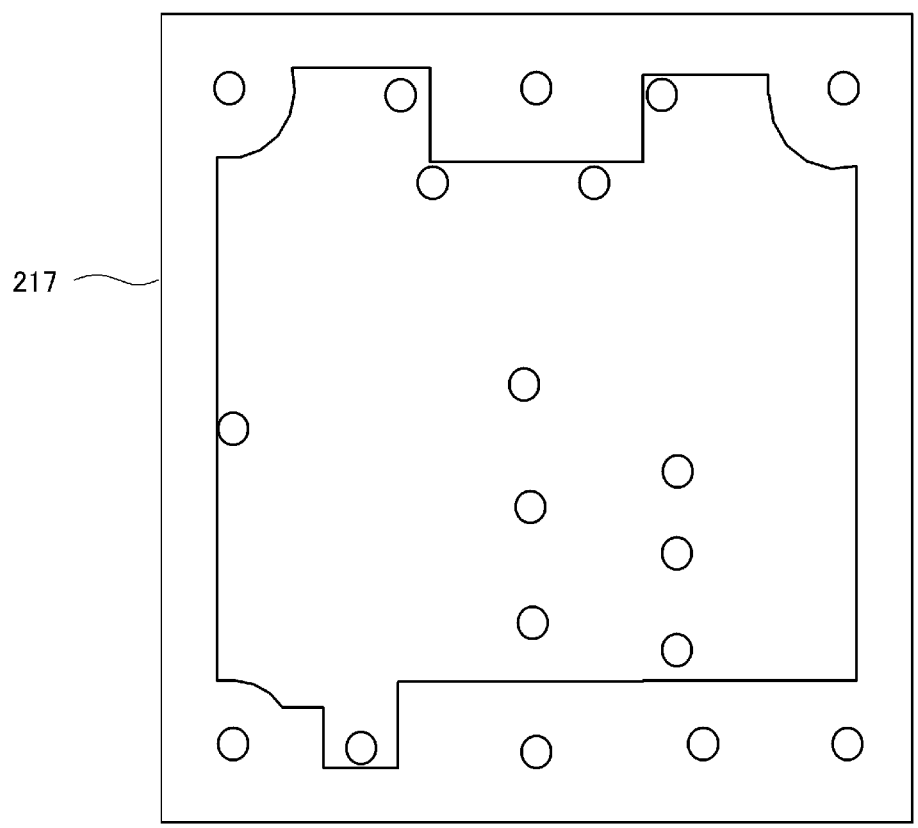
FIG. 22 is a plan view illustrating a top surface of a seventeenth dielectric layer in the laminated substrate illustrated in FIG. 4.

Here, the LPF 51 illustrated in FIG. 3 includes the inductor L1 that is configured as illustrated in FIG. 12 to FIG. 16 such that the conductor layers 340 to 344 from among the conductor layers 340 to 345 preferably wind in a clockwise direction, and the inductor L2 that is configured as illustrated in FIG. 17 such that the conductor layer 345 from among the conductor layers 340 to 345 preferably winds in an counterclockwise direction.

In addition, the HPF 30 illustrated in FIG. 3 includes the inductor L3 that is configured as illustrated in FIG. 12 to FIG. 17 such that the conductor layers 440 to 445 preferably wind in the same clockwise direction as the inductor L1. Furthermore, a portion of the inductor L3 is configured such that the conductor layer 445 preferably winds in a clockwise direction on the same dielectric layer 212 as the inductor L2.

Therefore, when a high-frequency signal passes through the LPF 51, a winding direction is reversed. Therefore, unnecessary coupling is unlikely to occur between the inductor L2 and the inductor L3. In addition, when a high-frequency signal passes through the HPF 30, unnecessary coupling is unlikely to occur between the inductor L3 and the inductor L2 for the same reason.

Figure 1A:
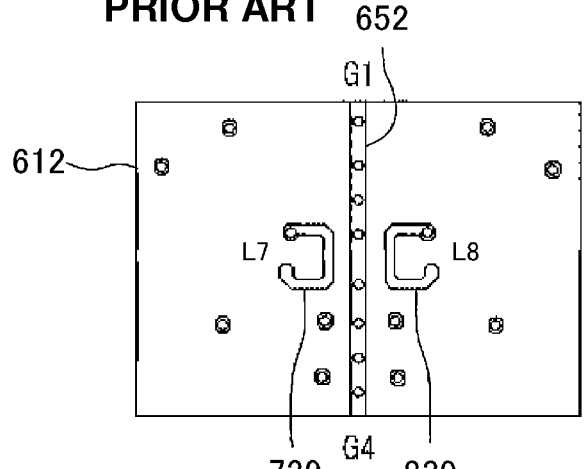
FIG. 1A is a plan view illustrating a top surface of a twelfth dielectric layer in a laminated substrate in Japanese Unexamined Patent Application Publication No. 2006-352532.
Figure 1B:
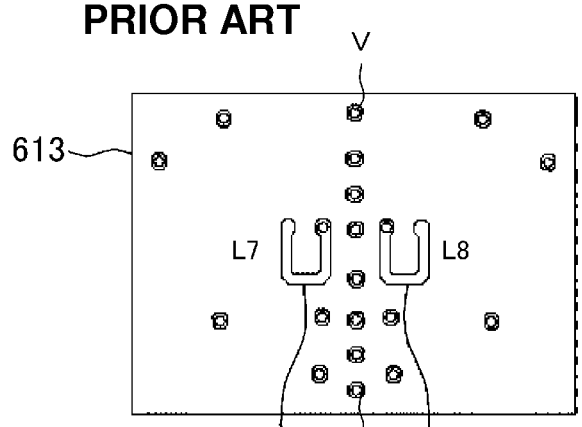
FIG. 1B is a plan view illustrating a top surface of a thirteenth dielectric layer in the laminated substrate in Japanese Unexamined Patent Application Publication No. 2006-352532, and FIG. 1C a plan view illustrating a top surface of a fourteenth dielectric layer in the laminated substrate in Japanese Unexamined Patent Application Publication No. 2006-352532.
Figure 1C:
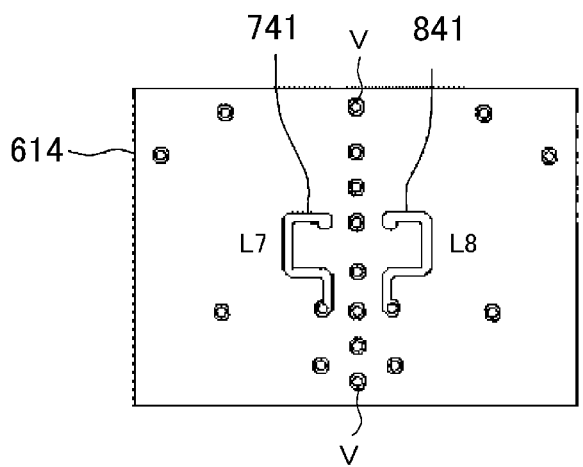

Accordingly, with the structure of the laminated substrate 200 according to this preferred embodiment, it is possible to reduce electromagnetic interference between the LPF 51 and the HPF 30. In addition, with the structure of the laminated substrate 200 according to this preferred embodiment, since it is not necessary to provide a space for the via electrodes V between the inductor L2 and the inductor L3 as in Japanese Unexamined Patent Application Publication No. 2006-352532 (refer to FIG. 1A to FIG. 1C), it is also possible to reduce the size the branching device 1.

In addition, the number of turns of the inductor L2 is extremely small as compared to the inductor L1, and the values of the self inductance and the mutual inductance thereof are extremely small as compared to the inductor L1. Therefore, when the high-frequency signal passes through the LPF 51, the influences of the reversely wound inductor L2 on the pass characteristic of the high-frequency signal in the LPF 51 and the high-frequency noise removal characteristic thereof are extremely small and may be negligible.

Here, the isolation characteristic of the branching device 1 in which the reversely wound inductor L2 is provided is compared to the isolation characteristic of an example of a modification to the branching device 1 in which the LPF 51 is configured by replacing the inductor L2 with an inductor that is wound in the same clockwise direction as the inductor L1 as in Japanese Unexamined Patent Application Publication No. 2006-352532.

FIG. 24 is a characteristic diagram illustrating the isolation characteristic of the branching device 1 according to a preferred embodiment of the present invention and the isolation characteristic of an example of a modification to the branching device 1. Here, the isolation characteristic indicates the attenuation amount of a signal leaking from the transmission signal terminal TxG to the reception signal terminal RxA, and the isolation characteristic is improved with the attenuation amount being increased. As a result of the measurement of the two isolation characteristics, it was shown that, by providing the reversely wound inductor L2 in the LPF 51 in the branching device 1, the attenuation amount of a signal between the transmission signal terminal TxG and the reception signal terminal RxA in a desired frequency band B is greatly improved. Namely, it was shown that the electromagnetic interference from the LPF 51 to the HPF 30 is significantly reduced.

While, in the above-mentioned preferred embodiment, the reversely wound inductor L2 is preferably provided in the LPF 51 as illustrated in FIG. 3, the inductor L2 may be provided in another LC filter circuit. In substantially the same manner, the inductor L3 may preferably be provided in another LC filter circuit. Here, for example, when the inductor L2 is provided in the LPF 20 and the inductor L3 is provided in the HPF 30, the LPF 20 corresponds to the "first LC filter circuit" according to a preferred embodiment of the present invention, and the HPF 30 corresponds to the "second LC filter circuit" according to a preferred embodiment of the present invention. In addition, when the inductor L2 is provided in the LPF 70 and the inductor L3 is provided in the HPF 30, the LPF 70 corresponds to the "first LC filter circuit" according to a preferred embodiment of the present invention, and the HPF 30 corresponds to the "second LC filter circuit" according to a preferred embodiment of the present invention. In this case, the LPF 70 and the HPF 30 allow signals in a same frequency band to pass therethrough. In substantially the same manner, when the inductor L2 is provided in the LPF 70 and the inductor L3 is provided in the LPF 20, the LPF 70 corresponds to the "first LC filter circuit" according to a preferred embodiment of the present invention, and the LPF 20 corresponds to the "second LC filter circuit" according to a preferred embodiment of the present invention.

In addition, while, in the above-described preferred embodiment, the number of turns of the inductor L2 is small as compared with the inductor L1, and thus, the inductance thereof is set to a value less than that of the inductor L1, the diameter of a winding wire or the magnetic permeability of the inductor L2 may be set to be small as compared with the inductor L1 at the time of implementation, and thus, the inductance thereof may be set to a value smaller than that of the inductor L1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A branching device comprising:
    an antenna terminal arranged to be connected to an antenna;
    at least two signal terminals;
    a first LC filter circuit connected between the antenna terminal and each of the at least two signal terminals and arranged to allow a signal in a first frequency band from among signals input from one of the antenna terminal and the at least two signal terminals to pass therethrough; and
    a second LC filter circuit connected between the antenna terminal and each of the at least two signal terminals and arranged to allow a signal in a second frequency band from among signals input from one of the antenna terminal and the at least two signal terminals to pass therethrough; wherein
    the first LC filter circuit and the second LC filter circuit are provided in a laminated substrate in which a dielectric layer on which a conductor pattern is provided is laminated;
    the first LC filter circuit includes a first inductor arranged such that a portion of a first coil conductor defined by the conductor pattern is wound in a predetermined direction, and a second inductor arranged such that a remaining portion of the first coil conductor defined by the conductor pattern is wound in a direction opposite to the predetermined direction;
    the second LC filter circuit includes a third inductor arranged such that a second coil conductor defined by the conductor pattern is wound in the predetermined direction; and
    at least a portion of the third inductor is disposed on the same dielectric layer as the second inductor.

2. The branching device according to claim 1, wherein an inductance of the second inductor is less than an inductance of the first inductor.

3. The branching device according to claim 1, wherein
    the first LC filter circuit is a filter circuit arranged to allow the signal in the first frequency band from among signals input from the at least two signal terminals to pass therethrough and output the signal to the antenna terminal; and
    the second LC filter circuit is a filter circuit arranged to allow the signal in the second frequency band from among signals received by the antenna terminal and input from the antenna terminal to pass therethrough and output the signal to the signal terminal.

4. The branching device according to claim 1, wherein
    the first LC filter circuit is a filter circuit arranged to allow the signal in the first frequency band from among signals received by the antenna terminal and input from the antenna terminal to pass therethrough and output the signal to the signal terminal; and
    the second LC filter circuit is a filter circuit arranged to allow the signal in the second frequency band from among signals input from the at least two signal terminals to pass therethrough and output the signal to the antenna terminal.

5. The branching device according to claim 1, wherein the first frequency band is the same as the second frequency band.

6. A branching device comprising:
    an antenna terminal arranged to be connected to an antenna;
    at least two signal terminals;
    a first LC filter circuit connected between the antenna terminal and each of the at least two signal terminals and arranged to allow a signal in a first frequency band from among signals input from one of the antenna terminal and the at least two signal terminals to pass therethrough; and
    a second LC filter circuit connected between the antenna terminal and each of the at least two signal terminals and arranged to allow a signal in a second frequency band from among signals input from one of the antenna terminal and the at least two signal terminals to pass therethrough; wherein
    the first LC filter circuit and the second LC filter circuit are provided in a laminated substrate in which a dielectric layer on which a conductor pattern is provided is laminated;
    the first LC filter circuit includes a first inductor arranged such that a portion of a first coil conductor defined by the conductor pattern is wound in a predetermined direction, and a second inductor arranged such that a remaining portion of the first coil conductor defined by the conductor pattern is wound in a direction opposite to the predetermined direction;
    the second LC filter circuit includes a third inductor arranged such that a second coil conductor defined by the conductor pattern is wound in the predetermined direction; and
    an inductance of the second inductor is less than an inductance of the first inductor.

7. The branching device according to claim 6, wherein
    the first LC filter circuit is a filter circuit arranged to allow the signal in the first frequency band from among signals input from the at least two signal terminals to pass therethrough and output the signal to the antenna terminal; and
    the second LC filter circuit is a filter circuit arranged to allow the signal in the second frequency band from among signals received by the antenna terminal and input from the antenna terminal to pass therethrough and output the signal to the signal terminal.

8. The branching device according to claim 6, wherein
    the first LC filter circuit is a filter circuit arranged to allow the signal in the first frequency band from among signals received by the antenna terminal and input from the antenna terminal to pass therethrough and output the signal to the signal terminal; and
    the second LC filter circuit is a filter circuit arranged to allow the signal in the second frequency band from among signals input from the at least two signal terminals to pass therethrough and output the signal to the antenna terminal.

9. The branching device according to claim 6, wherein the first frequency band is the same as the second frequency band.

* * * * *